United States Patent
Hattori et al.

(10) Patent No.: US 10,122,247 B2
(45) Date of Patent: Nov. 6, 2018

(54) INVERTER-INTEGRATED ELECTRIC COMPRESSOR

(71) Applicant: MITSUBISHI HEAVY INDUSTRIES THERMAL SYSTEMS, LTD., Minato-ku, Tokyo (JP)

(72) Inventors: Makoto Hattori, Aichi (JP); Masahiko Asai, Aichi (JP)

(73) Assignee: MITSUBISHI HEAVY INDUSTRIES THERMAL SYSTEMS, LTD., Tokyo (JP)

( * ) Notice: Subject to any disclaimer, the term of this patent is extended or adjusted under 35 U.S.C. 154(b) by 218 days.

(21) Appl. No.: 14/770,342

(22) PCT Filed: Mar. 31, 2014

(86) PCT No.: PCT/JP2014/059485
§ 371 (c)(1),
(2) Date: Aug. 25, 2015

(87) PCT Pub. No.: WO2014/175010
PCT Pub. Date: Oct. 30, 2014

(65) Prior Publication Data
US 2016/0020680 A1    Jan. 21, 2016

(30) Foreign Application Priority Data

Apr. 26, 2013   (JP) ................................ 2013-094276

(51) Int. Cl.
*H02K 11/02* (2016.01)
*H05K 7/14* (2006.01)
(Continued)

(52) U.S. Cl.
CPC .............. *H02K 11/02* (2013.01); *F04B 35/04* (2013.01); *F04B 39/121* (2013.01); *H02K 5/22* (2013.01);
(Continued)

(58) Field of Classification Search
CPC .......... H02K 11/30; H02K 11/02; H02K 5/22; H02K 11/33
(Continued)

(56) References Cited

U.S. PATENT DOCUMENTS 8,659,194 B2 * 2/2014 Motoda .................. H02K 11/33
310/64
8,803,383 B2 * 8/2014 Miyachi ............. H02K 11/0073
310/64

(Continued)

FOREIGN PATENT DOCUMENTS

CN     101187364 A    5/2008
CN     103119842 A    5/2013
(Continued)

OTHER PUBLICATIONS

Chinese Office Action and Search Report, dated Dec. 22, 2016, for Chinese Application No. 201480010658.9, including English translations.

*Primary Examiner* — Forrest M Phillips
(74) *Attorney, Agent, or Firm* — Birch, Stewart, Kolasch & Birch, LLP (57) ABSTRACT

In this inverter-integrated electric compressor, the circuit board of an inverter device is divided into: a main circuit board (23) having a shape and size that can be housed within an inverter housing section (8); and a sub-circuit board (26) that is electrically connected to the main circuit board (23). The main circuit board (23) is affixed and installed to boss sections (27) at at least the (four) corners, and is also affixed and supported by electrical components mounted to the circuit board (23). The sub-circuit board (26) has a flaring shape from the front end side to the back end side, and is affixed and installed to boss sections (31) at three front/back points in a space below the main circuit board (23) to the back of a bottom section inclined downwards toward the back from the front of the inverter housing section (8).

6 Claims, 6 Drawing Sheets

(51) Int. Cl.
*H02M 7/00* (2006.01)
*H02K 5/22* (2006.01)
*F04B 35/04* (2006.01)
*F04B 39/12* (2006.01)
*H02K 11/33* (2016.01)
*H02K 11/30* (2016.01)

(52) U.S. Cl.
CPC ............. *H02K 5/225* (2013.01); *H02K 11/30* (2016.01); *H02K 11/33* (2016.01); *H02M 7/003* (2013.01); *H05K 7/1432* (2013.01); *F04C 2240/808* (2013.01); *H02K 2211/03* (2013.01)

(58) Field of Classification Search
USPC ............................................ 310/71, 68 R, 72
See application file for complete search history.

(56) References Cited

U.S. PATENT DOCUMENTS

| | | | | |
|---|---|---|---|---|
| 8,882,479 | B2* | 11/2014 | Asai | F04B 35/04 310/68 R |
| 8,948,582 | B2* | 2/2015 | Kominami | F24H 9/20 165/175 |
| 9,351,432 | B2* | 5/2016 | Tsuboi | H05K 7/20854 |
| 9,397,529 | B2* | 7/2016 | Watanabe | F04B 35/04 |
| 2003/0200761 | A1* | 10/2003 | Funahashi | F01C 21/10 62/228.4 |
| 2009/0295325 | A1* | 12/2009 | Sekine | B62D 5/0406 318/646 |
| 2010/0223947 | A1 | 9/2010 | Shibuya | |
| 2010/0320880 | A1* | 12/2010 | Kamogi | H02K 11/33 310/68 B |
| 2011/0095659 | A1 | 4/2011 | Hattori et al. | |
| 2011/0286185 | A1* | 11/2011 | Abe | H05K 7/209 361/710 |
| 2012/0286605 | A1* | 11/2012 | Miyachi | B62D 5/0406 310/71 |
| 2013/0224050 | A1 | 8/2013 | Nakagami et al. | |

FOREIGN PATENT DOCUMENTS

| | | |
|---|---|---|
| EP | 1 034 983 A2 | 9/2000 |
| JP | 2000-261160 A | 9/2000 |
| JP | 2007-198341 A | 8/2007 |
| JP | 2007-295639 A | 11/2007 |
| JP | 2010-133366 A | 6/2010 |
| JP | 2012-120279 A | 6/2012 |
| JP | 2012-209414 A | 10/2012 |

* cited by examiner

INVERTER-INTEGRATED ELECTRIC COMPRESSOR

TECHNICAL FIELD

The present invention relates to an inverter-integrated electric compressor in which an inverter device is integrally incorporated into an inverter housing section of the housing.

BACKGROUND ART

Inverter-integrated electric compressors, which integrally incorporate inverter devices, are used as air conditioner compressors installed in electric vehicles, hybrid vehicles, and the like. This inverter-integrated electric compressor is configured so that high voltage direct current power supplied from a power supply unit installed in a vehicle is converted to three-phase alternating current power of a required frequency in an inverter device, which is then applied to the electric motor so that the electric motor is driven.

The inverter device is configured by a plurality of high-voltage electrical components such as a coil and a capacitor configuring a filter circuit for noise removal, a plurality of semiconductor switching elements such as IGBTs configuring a switching circuit for converting electric power, a circuit board on which an inverter circuit including the filter circuit and the switching circuit, or a control circuit thereof, is mounted, and the like. The inverter device is integrated by being incorporated into an inverter housing section provided on the outer periphery of the housing of the electric compressor.

Patent Document 1 discloses an invention with a configuration in which a control circuit board mounted with a capacitor or a microcomputer, an inverter circuit board mounted with an IGBT, or a circuit board integrating these two circuit boards is installed in a circuit casing on a housing side via a large number of columnar legs and heat generated by heat generating components is dissipated through the legs. Patent Document 2 discloses an invention with a configuration in which a power conversion circuit board mounted with a switching element, a capacitor, a coil, or the like is installed via an elastic member on a circuit board cover side, the circuit board cover is attached to an inverter installation surface on the housing side, a fluid member such as a gel material is arranged between each of the electrical components and the facing surface and a concave section on the installation surface side, whereby gaps are adjusted and the heat radiation property is secured.

Furthermore, Patent Document 3 discloses an invention in which an inverter circuit board is divided into two of a power system circuit board mounted with a switching element and a CPU circuit board mounted with a control circuit and integrated as a module via a case made of resin, the switching element is sealed with a thermosetting resin layer, and a silicon based elastic adhesive layer is provided between the thermosetting resin layer and the CPU circuit board, whereby the vibration resistance is secured.

CITATION LIST

Patent Literature

Patent Document 1: Japanese Unexamined Patent Application Publication No. 2007-198341A
Patent Document 2: Japanese Unexamined Patent Application Publication No. 2007-295639A
Patent Document 3: Japanese Unexamined Patent Application Publication No. 2010-133366A

SUMMARY OF INVENTION

Technical Problem

In a case where it is not possible to house a circuit board of an inverter device as a single circuit board due to restrictions due to the size of an inverter housing section, the circuit board is divided into a plurality of circuit boards; however, in any case, since it is necessary to secure vibration resistance with respect to running vibration of a vehicle or the like, portions other than at the four corners may be supported with support legs, a gel material for vibration proofing or for insulation may be filled in the inverter housing section, or sealing may be carried out using resin. Patent Document 1 discloses an invention in which, in addition to the peripheral portions of the circuit board, a central portion is also supported by columnar legs. In addition, Patent Document 2 discloses an invention in which a power conversion circuit board is installed via an elastic member on a cover side, and a fluid member formed of a gel-like material is arranged between the circuit board and the installation surface on the housing side.

Meanwhile, if it is otherwise possible to secure the vibration resistance of the circuit board, the installation of the central support legs or the filling of the gel material are inherently unnecessary. However, as described in Patent Documents 1 to 3, since circuit boards, which are integrated a filter circuit mounted with a coil, a capacitor, or the like, or a switching circuit mounted with a semiconductor switching element, are large, it is necessary to increase the number of central support legs or the filling amount of the gel material in order to secure the vibration resistance. In addition, in a case where the circuit board is divided into a plurality of circuit boards, it is necessary to secure the insulation between the circuit boards and to secure the vibration resistance for each of the circuit boards, which is a factor leading to increases in the size and weight of the inverter device and increased costs.

The present invention is created in consideration of the circumstances described above and an object of the present invention is to provide an inverter-integrated electric compressor which, through the use of inverter components or through the shape or the arrangement of the circuit board, secures the vibration resistance and insulation in the circuit board, reduces the gel material or the number of support legs, reduces the size of the inverter device, and lowers costs.

Solution to Problem

An inverter-integrated electric compressor of the present invention employs the following means to solve the above problems.

That is, an inverter-integrated electric compressor according to a first aspect of the present invention is an inverter-integrated electric compressor in which an inverter device including an inverter circuit board is integrally incorporated into an inverter housing section provided in a housing. The inverter circuit board is divided into a main circuit board having a shape and size that can be housed within the inverter housing section and a smaller sub-circuit board electrically connected to the main circuit board. The main circuit board is affixed and installed to boss sections at a minimum of four corners, and is also affixed and supported by electrical components mounted to the circuit board. The sub-circuit board has a flaring shape from the front end side to the back end side, and is affixed and installed to boss sections at three points which are one point at the front end side and two points at the back end side in a space below a main circuit board to the back of a bottom section inclined downwards toward the back from the front of the inverter housing section.

According to the first aspect of the present invention, in the inverter-integrated electric compressor in which an inverter device is integrally incorporated into an inverter housing section, the inverter circuit board is divided into a main circuit board having a shape and size that can be housed within the inverter housing section and a smaller sub-circuit board electrically connected to the main circuit board, and the main circuit board is affixed and installed to boss sections at a minimum of four corners, and is also affixed and supported by electrical components mounted to the circuit board. In addition, the sub-circuit board has a flaring shape from a front end side to a back end side, and is affixed and installed to boss sections at three points which are one point at the front end side and two points at the back end side in a space below a main circuit board to the back of a bottom section inclined downwards toward the back from the front of the inverter housing section. For this reason, it is possible to house the circuit board of the inverter in an inverter housing section for which the size is restricted by dividing the circuit board into a main circuit board and a sub-circuit board fitting the size of the inverter housing section. It is possible to install the main circuit board while securing vibration resistance by affixing and supporting the main circuit board with electrical components mounted to the circuit board in addition to the affixing and installing to the boss sections at the four corners. Meanwhile, the sub-circuit board has a flaring shape and it is possible to install the sub-circuit board while securing the vibration resistance and reducing the number of affixing locations by carrying out the affixing and installing at three points to the front and back in the space below the main circuit board to the back of a bottom section inclined downwards toward the back from the front of the inverter housing section. Accordingly, it is possible to install and reduce the size of the inverter device including two circuit boards by housing the inverter device in the inverter housing section with good unity. Also, it is possible to reduce the costs by increasing the vibration resistance of the main circuit board and the sub-circuit board, making the filling of a gel material or the like unnecessary, minimizing the affixing locations using screws, and the like.

Furthermore, an inverter-integrated electric compressor according to a second aspect of the present invention is the inverter-integrated electric compressor described above, in which a high voltage circuit and electrical components are mounted to the main circuit board and a low voltage circuit and electrical components are mounted to the sub-circuit board.

According to the second aspect of the present invention, a high voltage circuit and electrical components are mounted to the main circuit board and a low voltage circuit and electrical components are mounted to the sub-circuit board. For this reason, it is possible to install the low voltage sub-circuit board to be separated and insulated from the main circuit board to which a high voltage is applied. Accordingly, it is possible to suppress the propagation of electromagnetic noise from the high voltage main circuit board to the low voltage sub-circuit board and to prevent decreases in the reliability of control due to noise interference.

Furthermore, an inverter-integrated electric compressor according to a third aspect of the present invention is any one of the inverter-integrated electric compressors described above, in which a filter circuit for noise removal including a high voltage coil and capacitor, a switching circuit including a semiconductor switching element, and a control circuit thereof are mounted to the main circuit board and a low voltage communication circuit and constituent components thereof are mounted to the sub-circuit board.

According to the third aspect of the present invention, a filter circuit for noise removal including a high voltage coil and capacitor, a switching circuit including a semiconductor switching element, and a control circuit thereof are mounted to the main circuit board and a low voltage communication circuit and constituent components thereof are mounted to the sub-circuit board. For this reason, by separately installing the main circuit board to which a circuit including the high voltage coil or capacitor, the semiconductor switching elements, or the like is mounted and the sub-circuit board to which the low voltage communication circuit is mounted, it is possible to suppress noise interference between the two. Accordingly, communication errors or the like due to noise interference are reduced and it is possible to improve the reliability of the control.

Furthermore, an inverter-integrated electric compressor according to a fourth aspect of the present invention is the inverter-integrated electric compressors described above, in which the main circuit board has a rectangular shape, is affixed and installed to boss sections at a minimum of four corners in an upper section in the inverter housing section, and is also affixed and supported by the coil and capacitor configuring the filter circuit and a plurality of the semiconductor switching elements configuring the switching circuit, mounted to both sides thereof. Then, the sub-circuit board is affixed and installed at the three points in a space below the main circuit board between the coil and capacitor and a plurality of the semiconductor switching elements, mounted to both sides thereof.

According to the fourth aspect of the present invention, the main circuit board has a rectangular shape, is affixed and installed to boss sections at a minimum of four corners in an upper section in the inverter housing section, and is also affixed and supported by the coil and capacitor configuring the filter circuit and a plurality of the semiconductor switching elements configuring the switching circuit, mounted to both sides thereof. In addition, the sub-circuit board is affixed and installed at three points in a space below the main circuit board between the coil and capacitor and a plurality of the semiconductor switching elements mounted to both sides of the main circuit board. For this reason, the rectangular main circuit board is affixed and supported by the coil and capacitor for the filter circuit and the plurality of semiconductor switching elements for the switching circuit mounted to both sides thereof in addition to the boss sections at the four corners. At the same time, it is possible to affix and install the small sub-circuit board at three points using the space below the main circuit board between the coil and the capacitor and the plurality of semiconductor switching elements, mounted to both sides thereof. Accordingly, the main circuit board is affixed and supported by the mounted components and it is possible to secure the vibration resistance by increasing the fixing points. In addition, by arranging the sub-circuit board using the space between the electrical components, it is possible to install the inverter device and the circuit board by housing these in the inverter housing section with good unity and to achieve a reduction in size.

Furthermore, an inverter-integrated electric compressor according to a fifth aspect of the present invention is any one of the inverter-integrated electric compressors described above, in which the sub-circuit board is arranged such that an inclined side inclined in a flared shape obliquely intersects with a ridge line section of the bottom section inclined downwards toward the back from the front of the inverter housing section.

According to the fifth aspect of the present invention, the sub-circuit board is arranged such that an inclined side inclined in a flared shape obliquely intersects with a ridge line section of the bottom section inclined downwards toward the back from the front of the inverter housing section. For this reason, installation is possible with the sub-circuit board installed at a low position which is as close as possible to the bottom section of the inverter housing section but which does not contact the bottom section and with the distance to the main circuit board installed above increased to be as far as possible. Accordingly, it is possible to install two circuit boards in a narrow space while securing a sufficient insulation distance and it is possible to suppress noise interference while maintaining a compact size.

Furthermore, an inverter-integrated electric compressor according to a sixth aspect of the present invention is any one of the inverter-integrated electric compressors described above, in which, in the sub-circuit board, a connector of a communication cable connected to a circuit on the sub-circuit board is configured to be connected at a position at the shortest distance from the affixed portion of the communication cable passing through the inverter housing section.

According to the sixth aspect of the present invention, in the sub-circuit board, a connector of a communication cable connected to a circuit on the sub-circuit board is configured to be connected at a position at the shortest distance from the affixed portion of the communication cable passing through the inverter housing section. For this reason, in addition to the three fixing points to the front and back, it is also possible to affix and support the sub-circuit board at portions affixed by grommets or the like where the communication cable connected to the communication circuit passes through the inverter housing section. Accordingly, it is possible to support the sub-circuit board other than at the three fixing points to the front and back and it is possible to further improve the vibration reliability with respect to the sub-circuit board.

Advantageous Effects of Invention

According to the present invention, it is possible to house the circuit board of the inverter in an inverter housing section for which the size is restricted by dividing the circuit board into a main circuit board and a sub-circuit board fitting the size of the inverter housing section. Also, installation is possible while securing vibration resistance by affixing and supporting the main circuit board using electrical components mounted to the circuit board in addition to the affixing and installing to the boss sections at the four corners. Meanwhile, the sub-circuit board has a flaring shape and it is possible to install the sub-circuit board while securing the vibration resistance and reducing the number of affixing locations by affixing and installing the sub-circuit board at three points to the front and back in the space below a main circuit board to the back of a bottom section inclined downwards toward the back from the front of the inverter housing section. For this reason, it is possible to install the inverter device including two circuit boards by housing these in the inverter housing section with good unity and to achieve a reduction in size. Also, it is possible to reduce the costs by increasing the vibration resistance of the main circuit board and the sub-circuit board, making the filling of a gel material or the like unnecessary, minimizing the affixing locations using screws, and the like.

DESCRIPTION OF EMBODIMENTS

An embodiment of the present invention will be described below with reference to FIGS. 1 to 6.

Figure 1:
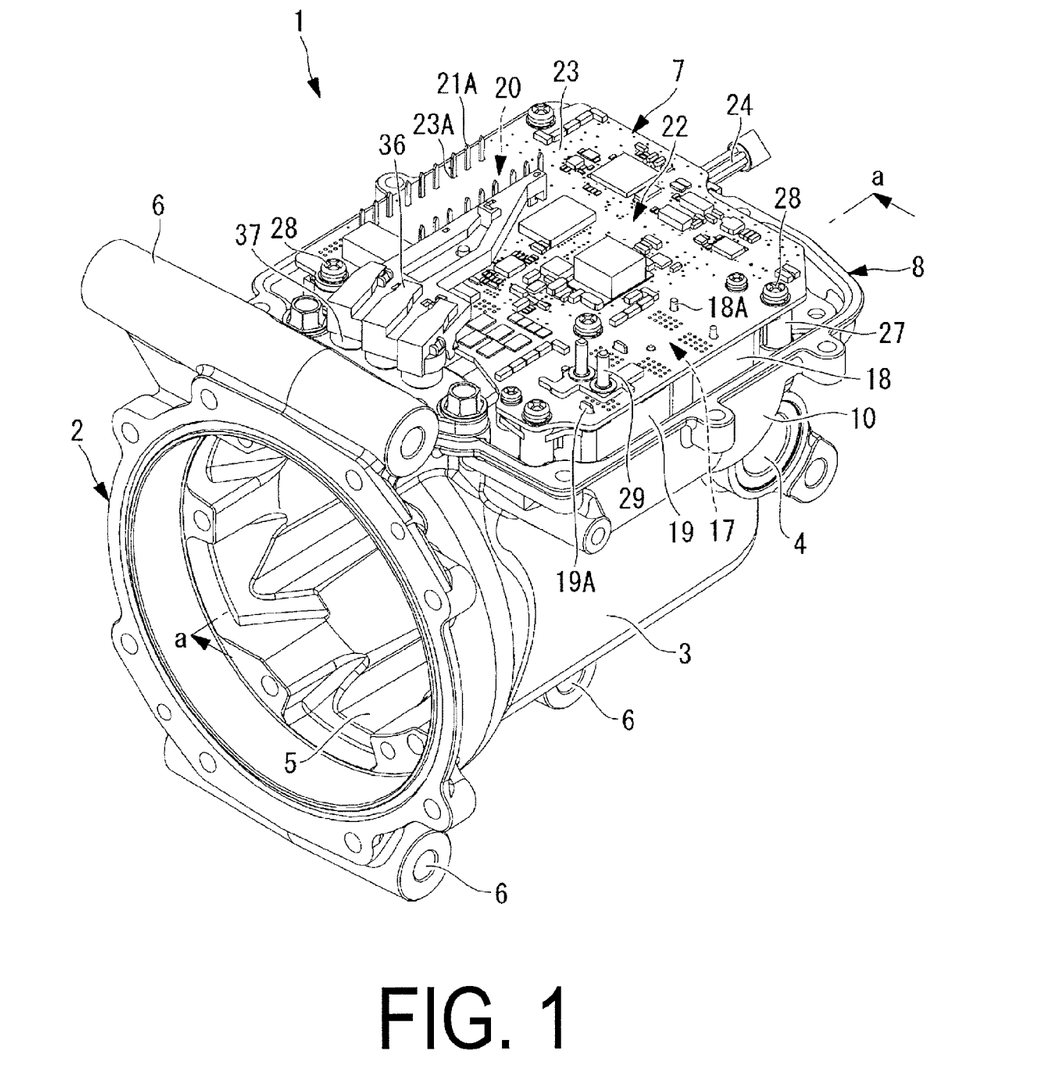
FIG. 1 is a perspective view illustrating a configuration of a main portion of an inverter-integrated electric compressor according to an embodiment of the present invention.
Figure 2:
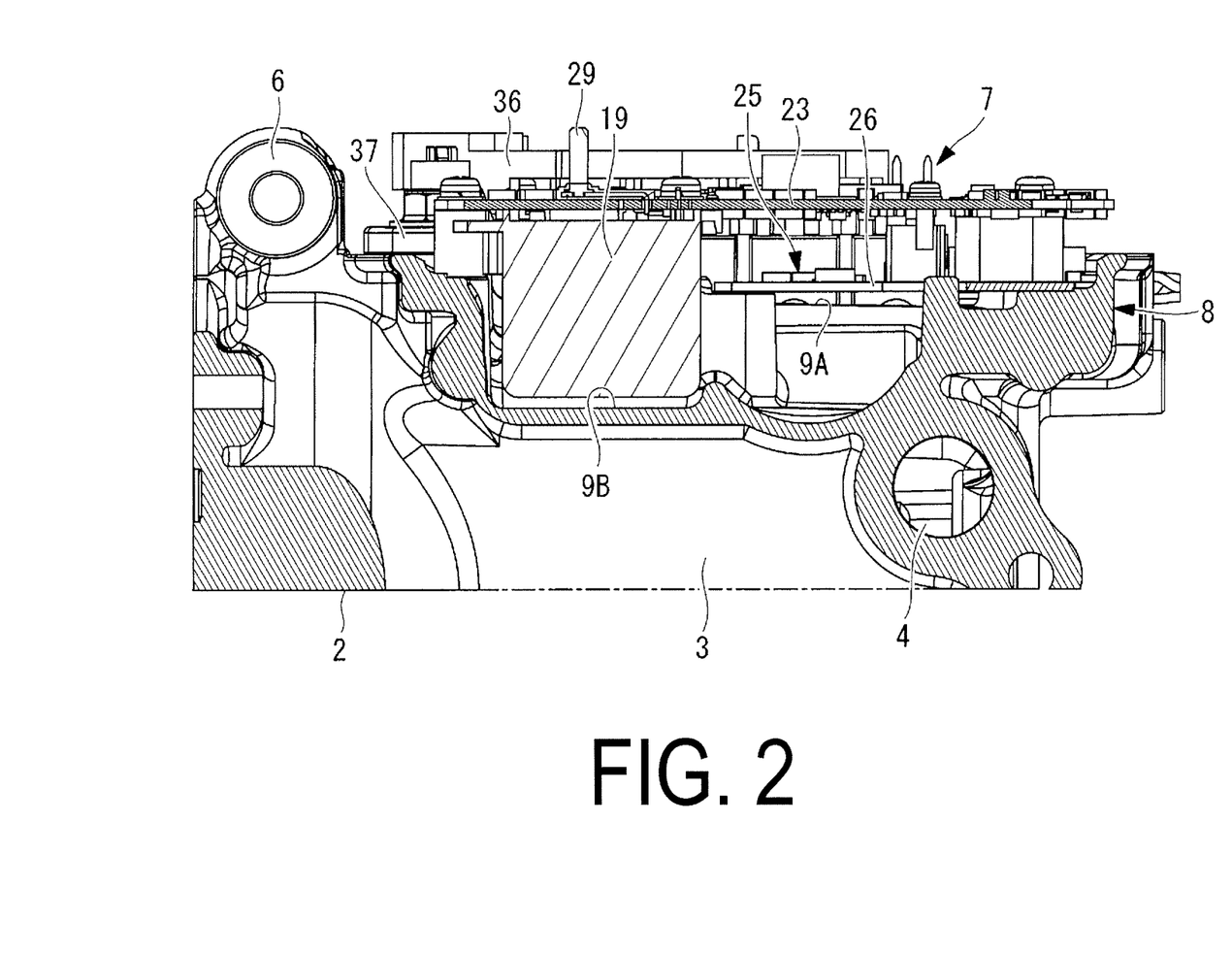
FIG. 2 is a corresponding longitudinal cross-sectional view along the line a-a in FIG. 1.
Figure 3:
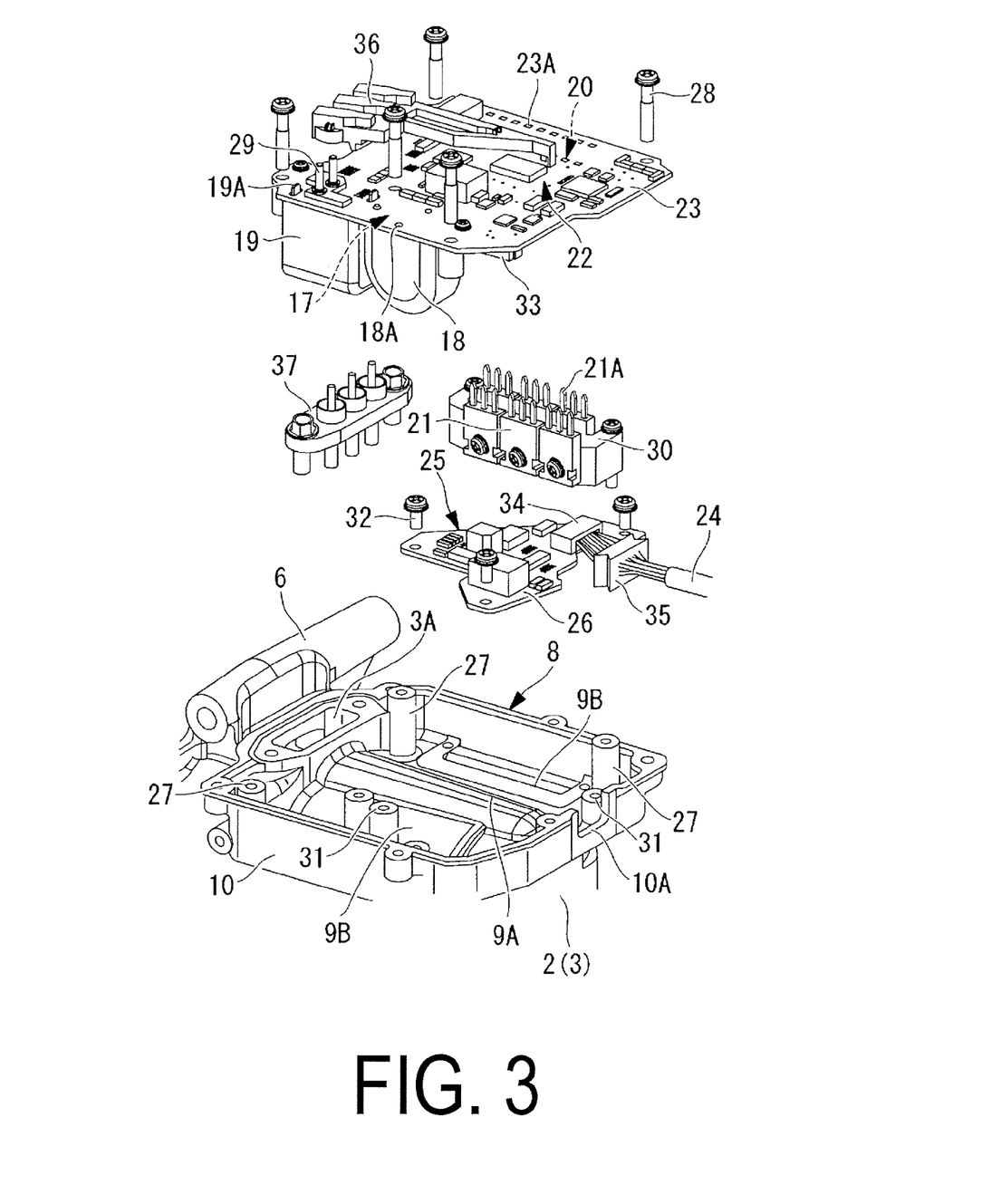
FIG. 3 is an exploded perspective view of an inverter device installed in an inverter housing section of the inverter-integrated electric compressor.
Figure 4:
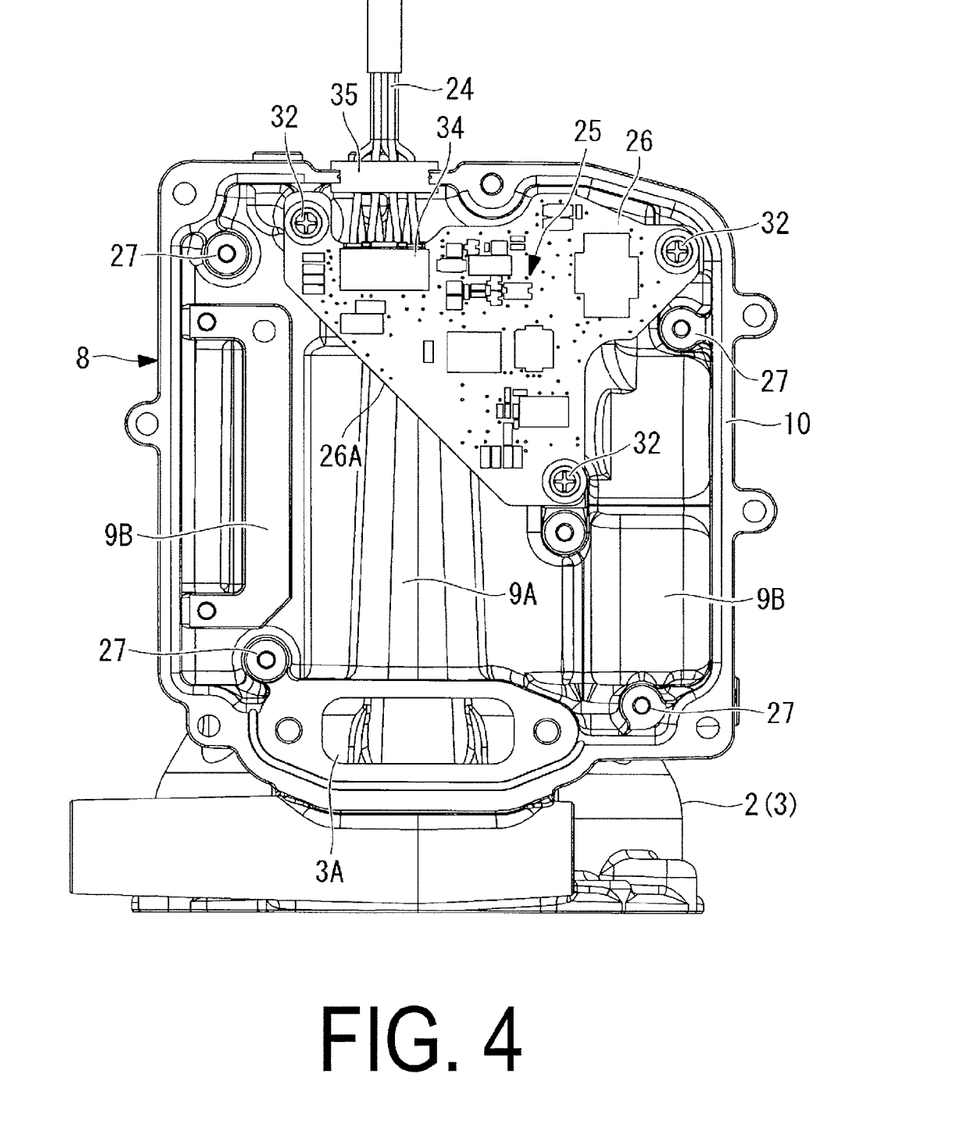
FIG. 4 is a plan view of an installation section of a sub-circuit board in the inverter housing section.
Figure 5:
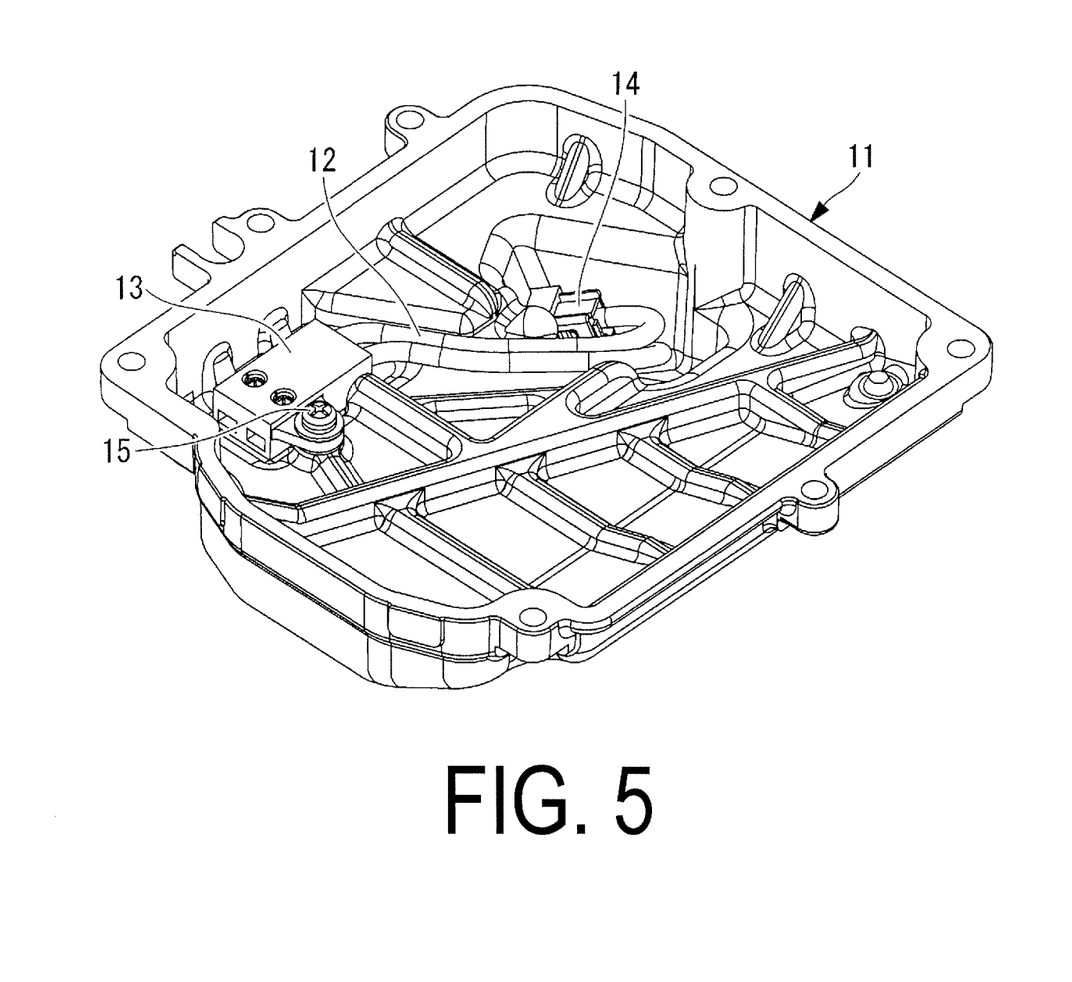
FIG. 5 is a back side perspective view of a cover which seals the inverter housing section.
Figure 6:
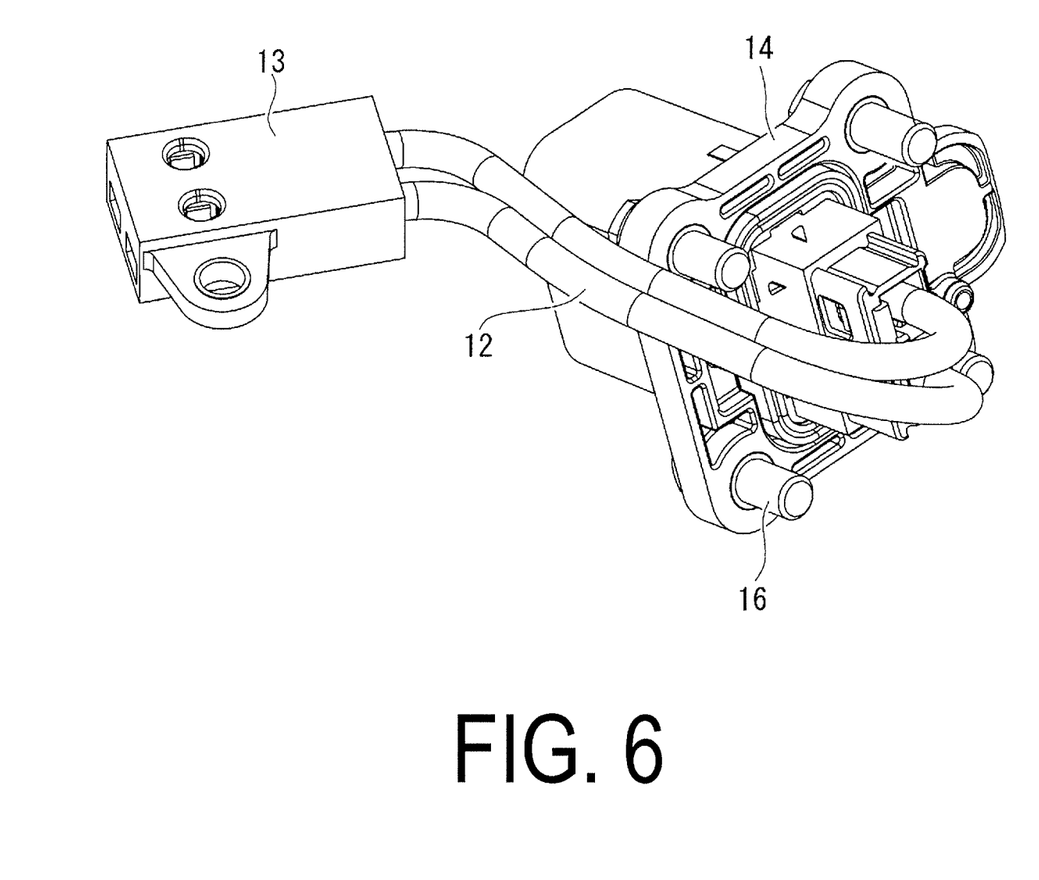
FIG. 6 is a perspective view of a single power cable connected to the cover.

FIG. 1 illustrates a perspective view of a main portion of an inverter-integrated electric compressor according to an embodiment of the present invention. FIG. 2 is a corresponding longitudinal cross-sectional view along the line a-a in FIG. 1. FIG. 3 is an exploded perspective view of an inverter device installed in an inverter housing section. FIG. 4 is a plan view of an installation section of a sub-circuit board in the inverter housing section. FIG. 5 is a back side perspective view of a cover which seals the inverter housing section. FIG. 6 illustrates a perspective view of a single power cable.

An inverter-integrated electric compressor 1 is provided with a cylindrical housing 2 forming an outer shell. The housing 2 is configured by integrally combining an aluminum die-cast motor housing 3 with a built-in electric motor (not illustrated) and an aluminum die-cast compressor housing (not illustrated) with a built-in compression mechanism (not illustrated).

The inverter-integrated electric compressor 1 has a configuration in which an electric motor and compression mechanism built inside the housing 2 are linked via a rotary shaft, the compression mechanism is driven by the electric motor being rotated and driven via an inverter device 7 to be described below, and low-pressure refrigerant gas drawn into the interior via an intake port 4 provided in a back end side surface of the motor housing 3 is suctioned in through the periphery of the electric motor and sent out to the outside after being discharged inside a compressor housing by being compressed to a high pressure in the compression mechanism.

A plurality of refrigerant flow paths 5 is formed in the motor housing 3 to allow refrigerant to flow in the axial direction along the inner circumferential surface thereof, and legs 6 for mounting the electric compressor 1 are provided at a plurality of locations on the outer circumference of the motor housing 3. An inverter housing section 8 for integrally incorporating the inverter device 7 is also integrally formed on the outer circumference of the housing 2 (on the motor housing 3 side). The inverter housing section 8 has a rectangular shape in plan view with a configuration in which the bottom section has a shape following the outer peripheral wall of the motor housing 3, a convex ridge line section 9A corresponding to a refrigerant flow path 5 is formed in the center section and concave sections 9B following the housing outer peripheral wall are formed on both side sections thereof, and a flange section 10 is set up around the periphery.

In the motor housing 3, since the refrigerant flow paths 5, which are coupled with the compressor housing, provided with draft angles from the front end side to the back end side, and provided on the inner peripheral side, have a cross-sectional area which increases in size from the intake port 4 side to the compression mechanism side, the ridge line section 9A and the like formed on the bottom surface in the inverter housing section 8 are also configured to incline downwards toward the back from the front.

The inverter housing section 8 is configured to be sealed by attaching a cover 11 illustrated in FIG. 5 to the flange 10 after incorporating the inverter device 7. A high-voltage cable (power cable) 12 is provided on the inner surface side of the cover 11. As illustrated in FIG. 6, the high voltage cable 12 has a connector 13 provided at one end side and a connector terminal 14, which is connected to the cable on the power source side, provided at the other end side. The high voltage cable 12 is configured such that the connector 13 at one end is affixed and installed by a screw 15 on the inner surface of the cover 11 at a position corresponding to a P-N terminal 29 provided on the main circuit board 23 to be described below and the connector terminal 14 at the other end is affixed and installed with a plurality of screws 16 from the outer surface side in a state where a terminal portion protrudes to the outer surface side of the cover 11.

The high voltage cable 12 is a part of a power cable and is connected via a power cable to a power supply unit mounted to a vehicle. By the connector 13 provided at one end of the high voltage cable 12 being connected to the P-N terminal 29 provided on the main circuit board 23 of the inverter device 7, high voltage direct current power supplied from the power supply unit is input to the inverter device 7.

As is well-known, the inverter device 7 converts high voltage direct current power supplied from the power supply unit installed in the vehicle to three-phase alternating current power of a required frequency based on a command from a host controller, and applies the alternating current power to an electric motor to rotate and drive the electric motor. As illustrated in FIG. 1 to FIG. 4, the inverter device 7 is integrally incorporated with the inverter housing section 8 provided on the outer periphery of the housing 2.

The inverter device 7 is configured by a plurality of high voltage electrical components such as a coil 18 and a capacitor 19 enclosed in a case and configuring a known filter circuit 17 for noise removal (hereinafter, referred to simply as electrical components), a plurality (six) of semiconductor switching elements 21 formed of heat generating power transistors such as IGBTs configuring a known switching circuit 20 for converting direct current power to three-phase alternating current power, the rectangular main circuit board 23 to which a control circuit 22 including an inverter circuit including the filter circuit 17 and the switching circuit 20, a microcomputer for control thereof, and the like are mounted, a small sub-circuit board 26 to which a communication circuit 25 connected via a communication cable 24 to a host controller is mounted, and the like.

The inverter device 7 may be known; however, here, as the main circuit board 23, a circuit board is used on which the electrical components such as the coil 18 and the capacitor 19 configuring the filter circuit 17 are mounted by soldering lead terminals 18A and 19A, and the plurality (six) of semiconductor switching elements 21 formed of heat generating power transistors such as IGBTs configuring the switching circuit 20 is mounted by soldering lead terminals 21A thereof (each IGBT has three of the lead terminals 21A to make a total of 18).

In other words, the filter circuit 17 and the switching circuit 20 are provided on the main circuit board 23 by passing lead terminals 18A and 19A of the coil 18 and the capacitor 19 configuring the filter circuit 17 and lead terminals 21A of the plurality of semiconductor switching elements 21 configuring the switching circuit 20 through respective through holes in the main circuit board 23 and mounting the lead terminals in a pattern on the circuit board by soldering. The main circuit board 23 has a rectangular shape and is set to a size which can be housed in the inverter housing section 8 and the four corners thereof are fastened and affixed with screws 28 to boss sections 27 provided at four corners of the inverter housing section 8.

The capacitor 19 which is one of the high-voltage electrical components configuring the filter circuit 17 is configured to be housed in a case and the outer shape is set to a rectangular shape (a cuboid shape) and the upper surface is set to a flat planar shape as illustrated in FIG. 2 and FIG. 3. In the same manner, the coil 18 wound into a cylindrical shape is configured to be housed in a case with a semi-cylindrical shape for which the upper surface is a flat planar shape. Then, the coil 18 and the capacitor 19 are mounted to be arranged in parallel along one side of the main circuit board 23 set to a rectangular shape.

Furthermore, the coil 18 and the capacitor 19 mounted to the main circuit board 23 are configured to support the lower surface of the main circuit board 23 on flat upper surfaces and to be able to support stress and vibration applied to the main circuit board 23 by being affixed and installed via an adhesive on the bottom surface set as the concave section 9B of one side section along an axial direction of the outer peripheral wall of the cylindrical housing 2 configuring the bottom surface in the inverter housing section 8. In addition, by the connector 13 of the high voltage cable 12 being connected to the upper surface side of the portion, which is supported by the capacitor 19, of the main circuit board 23 where the lower surface is supported by the coil 18 and the capacitor 19, the P-N terminal 29 which inputs direct current power from the power source to the inverter device 7 is configured to face upwards.

In addition, as illustrated in FIG. 3, the plurality (six) of the semiconductor switching elements 21 is affixed and installed on a heat-radiating block 30 provided on the concave section 9B of the other side section along the axial direction of the outer peripheral wall of the cylindrical housing 2 configuring the bottom surface in the inverter housing section 8. The heat-radiating block 30 is a block with a cuboid parallelpiped shape having a predetermined length made of an aluminum alloy which is a thermally conductive material, the semiconductor switching elements 21 on both the left and right vertical side surfaces are installed three-dimensionally by screwing and affixing three of the lead terminals 21A three at a time respectively thereto to face upward. The heat-radiating block 30 has a function of dissipating heat generated by the semiconductor switching elements 21 to the housing 2 side and cooling the semiconductor switching elements 21.

As illustrated in FIG. 1, a total of 18 of the lead terminals 21A of the plurality of semiconductor switching elements 21 installed as described above are configured to protrude upward through holes 23A provided along the other side corresponding to one side of the main circuit board 23 supported by the coil 18 and the capacitor 19, and be mounted to the main circuit board 23 by being soldered at this section. Due to this, the configuration is able to support the other side opposing the one side of the main circuit board 23 from below with the large number of lead terminals 21A of the plurality of semiconductor switching elements 21. Here, the heat-radiating block 30 is screwed and affixed to the concave section 9B in the inverter housing section 8, but may be configured to be formed integrally on the motor housing 3 side.

Furthermore, at the back of the central section of the bottom surface of the inverter housing section 8, as illustrated in FIG. 4, the sub-circuit board 26 to which the communication circuit 25 connected to the communication cable 24 is mounted is affixed and installed with screws 32 to boss sections 31 at three places so as not to contact the convex ridge line section 9A. The sub-circuit board 26 is a small circuit board which is much smaller than the main circuit board 23, is a substantially triangular-shaped circuit board with a flaring shape from the front end side to the back end side in consideration of the vibration resistance, and is affixed and installed as described above at three locations of one point at the front end and two points at the back end.

In addition, the sub-circuit board 26 is disposed in the space between the coil 18 and the capacitor 19 for the filter circuit 17 and the plurality of semiconductor switching elements 21 for the switching circuit 20 arranged on both the left and right sides of the inverter housing section 8 as described above. The sub-circuit board 26 is arranged below the main circuit board 23 such that an inclined side 26A inclined in a flared shape obliquely intersects with the ridge line section 9A inclined downwards toward the back from the front at a back position in the central section of the bottom surface of the inverter housing section 8 such that it is possible to increase the distance between the two circuit boards 23 and 26 to be as far as possible.

The sub-circuit board 26 and the main circuit board 23 arranged above are able to electrically and mechanically connect with each other via an inter-circuit board connection terminal 33 (refer to FIG. 3). Accordingly, it is also possible to support a portion of the main circuit board 23 from below with the inter-circuit board connection terminal 33. In addition, it is possible to connect the communication cable 24 to the sub-circuit board 26 via a connector 34 and a connection section of the connector 34 on the sub-circuit board 26 side is provided along the back end side of the sub-circuit board 26.

Meanwhile, a sealing grommet 35 is installed in a notch section 10A provided in the flange section 10 of the inverter housing section 8 and the communication cable 24 passes through the inside of the inverter housing section 8 via the grommet 35. Then, the communication cable 24 is connected via the connector 34 to the sub-circuit board 26 at a position at the shortest distance from the affixed portion by the grommet 35 and is configured such that it is possible to affix and support one end of the sub-circuit board 26 with the communication cable 24.

Furthermore, the power converted from direct current power to three-phase alternating current power through the switching circuit 20 of the inverter device 7 is output via a UVW busbar 36 from the main circuit board 23 side to a glass sealing terminal 37. The glass sealing terminal 37 is installed in a terminal installation hole 3A (refer to FIG. 3) provided so as to pass through the motor housing 3 in a front portion in the inverter housing section 8, and is a terminal applying three-phase alternating current power from the UVW busbar 36 to the electric motor in the motor housing 3. The UVW busbar 36 installed on the main circuit board 23 is linked with the glass sealing terminal 37 and one side of the main circuit board 23 is affixed and supported due to this.

As described above, in the present embodiment, the circuit board of the inverter device 7 is configured to be divided into two of the main circuit board 23 to which the filter circuit 17 including the high voltage coil 18 and the capacitor 19, the control circuit 22 including the switching circuit 20 including the plurality of semiconductor switching elements 21 such as IGBTs, the microcomputer, and the like are mounted, and the sub-circuit board 26 to which the low voltage communication circuit 25 is mounted, and noise interference is suppressed by both of the circuit boards 23 and 26 being installed in a separated and insulated state while preserving a set distance vertically.

In addition, the main circuit board 23, which has a rectangular shape and is comparatively large, is housed and installed by being affixed with the screws 28 to the boss sections 27 at a minimum of four corners in the inverter housing section 8, while the sub-circuit board 26, which has a flared, substantially triangular shape from the front end side to the back end side, is housed and installed in a space below the main circuit board 23 between the coil 18 and the capacitor 19 and the plurality of semiconductor switching elements 21 mounted to both sides of the main circuit board 23. In addition, the sub-circuit board 26 is housed and installed by being affixed with the screws 32 to the boss sections 31 at three points of one point at the front end side and two points at the back end side at the back side of the bottom section inclined downwards toward the back from the front of the inverter housing section 8, and the inverter device 7 is configured to be housed and installed in a compact manner with a good fit.

Furthermore, in addition to being fastened and affixed with the screws 28 at four corners to the boss sections 27, the main circuit board 23 is configured so as to be supported from below at one side by the coil 18 and the capacitor 19 which are a plurality of high voltage electrical components configuring the filter circuit 17 of the inverter device 7 and supported from below at the other side opposite thereto by a large number of the lead terminals 21A of the plurality of semiconductor switching elements 21 such as IGBTs configuring the switching circuit 20 of the inverter device 7.

In addition, as well as the above, the center-side region of the main circuit board 23 is supported from below by the inter-circuit board connection terminal 33 electrically and mechanically connected between the main circuit board 23 and the sub-circuit board 26 arranged therebelow, and the other side is affixed and supported by a connection between the glass sealing terminal 37 and the UVW busbar 36. For this reason, by receiving stress such as excitation force applied to the main circuit board 23 due to the running vibration of the vehicle, pushing force applied to the main circuit board 23 when inserting the connector 13 into the P-N terminal 29, or the like at a large number of support points and fixing points as described above, it is possible to disperse and mitigate the stress and to achieve an improvement in the vibration resistance.

Meanwhile, the sub-circuit board 26 is a substantially triangular-shaped circuit board with a flared shape which is able to reduce the number of fixing points while increasing the vibration proofing performance. Meanwhile, the sub-circuit board 26 is affixed and installed with screws 32 to the boss sections 31 at three points of one point at the front end side and two points at the back end side by the inclined side 26A obliquely inclined in the flaring shape intersecting with but not contacting the ridge line section 9A of the bottom section in a space as low as possible at the back side of the bottom section inclined downwards from the front of the inverter housing section 8 to the back. Due to this, an insulation distance to the main circuit board 23 is secured and it is possible to secure the vibration resistance and to reduce the number of affixing locations to three locations.

In addition, in the sub-circuit board 26, the connector 34 of the communication cable 24 connected to the communication circuit 25 on the circuit board is configured to be connected to the communication circuit 25 at a position at the shortest distance from the portion, which is affixed by the grommet 35, of the communication cable 24 passing through the inverter housing section 8. Due to this, other than the three fixing points at the front and back, the sub-circuit board 26 is able to be affixed and supported at affixed portions where the communication cable 24 connected to the communication circuit 25 passes through the inverter housing section 8 and the vibration proofing reliability of the sub-circuit board 26 is improved.

Thus, according to the present embodiment, in the inverter-integrated electric compressor 1 where the inverter device 7 is integrally incorporated into the inverter housing section 8, the circuit board of the inverter device 7 is divided into the main circuit board 23 with a shape and size which can be housed in the inverter housing section 8 and the smaller sub-circuit board 26 electrically connected to the main circuit board 23. In addition, the main circuit board 23 is affixed and installed with the screws 28 at a minimum of four corners to the boss sections 27 and is also affixed and supported by electrical components such as the coil 18 and the capacitor 19, the plurality of semiconductor switching elements 21, and the like mounted to the circuit board 23. The sub-circuit board 26 has a flaring shape from the front end side to the back end side and is affixed and installed with the screws 32 to the boss sections 31 at three points of one point at the front end side and two points at the back end side in the space below the main circuit board 23 on the back side of the bottom section inclined downwards toward the back from the front of the inverter housing section 8.

In this manner, with respect to the inverter housing section 8 for which the size is restricted, it is possible to house the circuit board of the inverter device 7 by dividing the circuit board into the main circuit board 23 and the sub-circuit board 26 fitting the size of the inverter housing section 8 and the vibration resistance is secured by affixing and supporting the main circuit board 23 with electrical components such as the coil 18, the capacitor 19, and the plurality of semiconductor switching elements 21 mounted to the main circuit board 23 in addition to the main circuit board 23 being affixed and installed to the boss sections 27 at the four corners. Meanwhile, the sub-circuit board 26 has a flaring shape and it is possible to install the sub-circuit board 26 while securing the vibration resistance thereof and reducing the number of affixing locations by affixing and installing the sub-circuit board 26 to the boss sections 31 at three points to the front and back in the space below the main circuit board 23 to the back of a bottom section inclined downwards toward the back from the front of the inverter housing section 8.

For this reason, the inverter device 7 including the two of the main circuit board 23 and the sub-circuit board 26 is installed and housed with good unity in the inverter housing section 8, it is possible to achieve a reduction in the size of the inverter device 7 and the inverter-integrated electric compressor 1, and it is possible to reduce the costs by increasing the vibration resistance of the main circuit board 23 and the sub-circuit board 26, making the filling of a gel material or the like unnecessary, minimizing the affixing locations using screws, and the like.

In addition, the high voltage filter circuit 17, the switching circuit 20, the control circuit 22 and the electrical components such as the coil 18, the capacitor 19, the semiconductor switching elements 21 configuring these circuits, and the like are mounted to the main circuit board 23, while the low voltage communication circuit 25, the electrical components thereof, and the like are mounted to the sub-circuit board 26. For this reason, it is possible to install the low voltage sub-circuit board 26 to be separated and insulated from the main circuit board 23 to which a high voltage is applied. Accordingly, it is possible to suppress the propagation of electromagnetic noise from the high voltage main circuit board 23 to the low voltage sub-circuit board 26 and to prevent decreases in the reliability of control due to noise interference.

In addition, the filter circuit 17 for noise removal including the high voltage electrical components such as the coil 18 and the capacitor 19, the switching circuit 20 including the electrical components such as the semiconductor switching elements 21, and the control circuit 22 thereof are mounted to the main circuit board 23, and the low voltage communication circuit 25 and the electrical components configuring the circuits thereof are mounted to the sub-circuit board 26. For this reason, by separating, insulating and installing the main circuit board 23 to which the high voltage coil 18 and the capacitor 19, or the circuit 20 configuring the semiconductor switching elements 21 or the like are mounted and the sub-circuit board 26 to which the low voltage communication circuit 25 is mounted, it is possible to suppress noise interference between the two.

Due to this, it is possible to suppress the propagation of electromagnetic noise from the high voltage main circuit board 23 to the low voltage sub-circuit board 26 and to improve the reliability of control by preventing decreases in the reliability of control and communication errors due to noise interference, or the like.

In addition, in the present embodiment, the main circuit board 23 has a rectangular shape, is screwed and affixed to the boss sections 27 at a minimum of four corners in the upper section in the inverter housing section 8, and is also affixed and supported by the coil 18 and the capacitor 19 configuring the filter circuit 17 and the plurality of the semiconductor switching elements 21 configuring the switching circuit 20, mounted to both sides thereof. In addition, the sub-circuit board 26 is screwed and affixed to the boss sections 31 at three points in a space below the main circuit board 23 between the coil 18 and the capacitor 19 and the plurality of semiconductor switching elements 21, mounted to both sides of the main circuit board 23.

For this reason, other than at the four corners of the boss sections 27, the rectangular main circuit board 23 is affixed and supported by the coil 18 and the capacitor 19 for the filter circuit 17 and the plurality of semiconductor switching elements 21 for the switching circuit 20, mounted to both sides thereof. At the same time, it is possible to affix and install the small sub-circuit board 26 at three points to the boss sections 31 using the space below the main circuit board 23 between the coil 18 and the capacitor 19 and the plurality of semiconductor switching elements 21 mounted to both sides of the main circuit board 23. Accordingly, it is possible to secure the vibration resistance by affixing and supporting the main circuit board 23 by the mounted components thereof and increasing the fixing points, and it is possible to house and install the inverter device 7 and the circuit boards 23 and 26 in the inverter housing section 8 with good unity and to achieve a reduction in the size by arranging the sub-circuit board 26 in the space between the electrical components.

Furthermore, the sub-circuit board 26 is arranged such that the inclined side 26A inclined in a flared shape obliquely intersects with the ridge line section 9A of the bottom section inclined downwards toward the back from the front of the inverter housing section 8. For this reason, installation is possible with the sub-circuit board 26 installed at a low position which is as close as possible to the bottom section of the inverter housing section but which does not contact the bottom section and with the distance to the main circuit board 23 installed above increased to be as far as possible. Accordingly, it is possible to install both of the circuit boards 23 and 26 in a narrow space while securing a sufficient insulation distance, and it is possible to suppress noise interference while maintaining a compact size.

In addition, on the sub-circuit board 26 described above, the connector 34 of the communication cable 24 connected to the communication circuit 25 on the sub-circuit board 26 is configured to be connected at a position at the shortest distance from the affixing portion of the communication cable 24 passing through the inverter housing section 8. For this reason, other than the three fixing points at the front and back, it is also possible to affix and support the sub-circuit board 26 at affixing portions using the grommet 35 or the like where the communication cable 24 connected to the communication circuit 25 passes through the inverter housing section 8. Due to this, it is possible to support the sub-circuit board 26 other than at the three fixing points to the front and back and it is possible to further improve the vibration proofing reliability of the sub-circuit board 26.

Note that the present invention is not limited to the invention according to the embodiment as described above, and changes can be made as appropriate without departing from the gist thereof. For example, in the embodiment described above, the P-N terminal 29 installed on the upper surface of the main circuit board 23 is configured to be installed at a position above the capacitor 19. However, the P-N terminal 29 may be configured to be installed at a position above the coil 18. In addition, the heat-radiating block 30 for installing the plurality of semiconductor switching elements 21 has a cuboid shape; however, as long as the side surfaces on which the plurality of semiconductor switching elements 21 is affixed and installed are vertical surfaces, it is not always necessary for the heat-radiating block 30 to be a cuboid.

Furthermore, naturally, the main circuit board 23 and the sub-circuit board 26 may be affixed and supported at support points and fixing points other than the support points and fixing points exemplified in the embodiment described above. In addition, the method for supplying direct current power to the inverter device 7 is not limited to that of the embodiment described above, and may be any method or configuration. In addition, the flaring shape of the sub-circuit board 26 may be a trapezoidal shape in which the width of the front end side is narrowed other than the triangular shape.

REFERENCE SIGNS LIST

1 Inverter-integrated electric compressor
2 Housing
3 Motor housing
7 Inverter device
8 Inverter housing section
9A Ridge line section of bottom section of inverter housing section
17 Filter circuit
18 Coil (high-voltage electrical component)
19 Capacitor (high-voltage electrical component)
20 Switching circuit
21 Semiconductor switching element (high-voltage electrical component)
22 Control circuit
23 Main circuit board
24 Communication cable
25 Communication circuit
26 Sub-circuit board
26A Inclined side
27 Boss section
31 Boss section
34 Connector

The invention claimed is:

1. An inverter-integrated electric compressor in which an inverter device including an inverter circuit board is integrally incorporated into an inverter housing section provided in a housing,
the inverter circuit board being divided into a main circuit board having a shape and size that can be housed within the inverter housing section and a smaller sub-circuit board electrically connected to the main circuit board,
the main circuit board being affixed and installed to boss sections at a minimum of four corners, and being also affixed and supported underneath by a top area of electrical components mounted to the circuit board, the electrical components having a bottom area being adhered to a concave section of a side section along an axial direction of an outer peripheral wall of said housing, and
the sub-circuit board having a flaring shape from a front end side to a back end side, and being affixed and installed to boss sections at three points which are one point at the front end side and two points at the back end side in a space below the main circuit board to the back of a bottom section inclined downwards toward the back from the front of the inverter housing section.

2. The inverter-integrated electric compressor according to claim 1, wherein a high voltage circuit and electrical components are mounted to the main circuit board and a low voltage circuit and electrical components are mounted to the sub-circuit board.

3. The inverter-integrated electric compressor according to claim 1, wherein a filter circuit for noise removal including a high voltage coil and a capacitor, a switching circuit including a semiconductor switching element, and a control circuit thereof are mounted to the main circuit board and a low voltage communication circuit and constituent components thereof are mounted to the sub-circuit board.

4. The inverter-integrated electric compressor according to claim 3, wherein the main circuit board has a rectangular shape, is affixed and installed to boss sections at a minimum of four corners in an upper section in the inverter housing section, and is also affixed and supported by the coil and the capacitor configuring the filter circuit and a plurality of the semiconductor switching elements configuring the switching circuit mounted to both sides thereof, and the sub-circuit board is affixed and installed at the three points in a space below the main circuit board between the coil and capacitor and a plurality of the semiconductor switching elements, mounted to both sides thereof.

5. The inverter-integrated electric compressor according to claim 1, wherein the sub-circuit board is arranged such that an inclined side inclined in a flared shape obliquely intersects with a ridge line section of the bottom section inclined downwards toward the back from the front of the inverter housing section.

6. The inverter-integrated electric compressor according to claim 3, wherein, in the sub-circuit board, a connector of a communication cable connected to a circuit on the sub-circuit board is configured to be connected at a position at the shortest distance from the affixed portion of the communication cable passing through the inverter housing section.

* * * * *